United States Patent
Matsuki et al.

(10) Patent No.: US 9,960,007 B2
(45) Date of Patent: May 1, 2018

(54) ELECTRON BEAM IRRADIATION DEVICE

(71) Applicant: Toshiba Memory Corporation, Tokyo (JP)

(72) Inventors: Kazuto Matsuki, Tokyo (JP); Ryoichi Susuki, Kanagawa (JP); Hiroyuki Kashiwagi, Kanagawa (JP); Takashi Sato, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days. days.

(21) Appl. No.: 15/251,554

(22) Filed: Aug. 30, 2016

(65) Prior Publication Data

US 2017/0076907 A1     Mar. 16, 2017

(30) Foreign Application Priority Data

Sep. 11, 2015  (JP) ................................. 2015-180089

(51) Int. Cl.
  *H01J 37/073*    (2006.01)
  *H01J 37/20*     (2006.01)

(52) U.S. Cl.
  CPC ............ *H01J 37/073* (2013.01); *H01J 37/20* (2013.01); *H01J 2237/202* (2013.01)

(58) Field of Classification Search
  CPC .. H01J 37/00; H01J 37/02; H01J 37/26; H01J 37/261; H01J 37/226; H01J 37/228
  USPC ......... 250/492.1, 492.3, 306, 307, 309, 310, 250/311
  See application file for complete search history.

(56) References Cited

U.S. PATENT DOCUMENTS

| | | | | |
|---|---|---|---|---|
| 5,939,720 A | * | 8/1999 | Todoroko | ................ H01J 37/28 250/310 |
| 2007/0188090 A1 | * | 8/2007 | Kimiya | .................... H01J 1/46 313/506 |
| 2008/0042563 A1 | | 2/2008 | Niigaki et al. | |
| 2009/0101817 A1 | * | 4/2009 | Ohshima | ............... H01J 37/244 250/310 |
| 2010/0146667 A1 | | 6/2010 | Niigaki et al. | |

FOREIGN PATENT DOCUMENTS

| | | |
|---|---|---|
| JP | 2007-175584 | 7/2007 |
| JP | 2008-39766 | 2/2008 |
| JP | 2010-78584 | 4/2010 |
| JP | 2012-233779 | 11/2012 |
| JP | 2015-26631 | 2/2015 |

* cited by examiner

*Primary Examiner* — Nicole Ippolito
(74) *Attorney, Agent, or Firm* — Finnegan, Henderson, Farabow, Garrett & Dunner, L.L.P.

(57) ABSTRACT

An electron beam irradiation device includes a stage, a main body unit, and a first mechanism. The main body unit includes a substrate, first members, and a first layer. The first members are arranged to be separated in a second direction intersecting a first direction and is provided at a first surface of the substrate opposing the stage. The first layer is provided between the stage and the first members and between the stage and the substrate. The first layer converts a light ray into an electron beam. The first mechanism is provided in the stage and moves the stage in the second direction. A distance of the movement is not less than a spacing between a center in the second direction of the first member and a center in the second direction of one other first member adjacent to the first member.

19 Claims, 6 Drawing Sheets

ELECTRON BEAM IRRADIATION DEVICE

CROSS-REFERENCE TO RELATED APPLICATIONS

This application is based upon and claims the benefit of priority from Japanese Patent Application No. 2015-180089, filed on Sep. 11, 2015; the entire contents of which are incorporated herein by reference.

FIELD

Embodiments described herein relate generally to an electron beam irradiation device.

BACKGROUND

There is technology for irradiating an electron beam (EB) to modify a semiconductor material. Other than semiconductors, for example, electron beam irradiation also is used in applications such as curing ink, modifying films, sterilization, etc. There is an electron beam irradiation device that utilizes photoelectric conversion. Surface plasmon resonance is utilized in such an electron beam irradiation device. Thereby, the efficiency of the photoelectric conversion can be increased; but it is difficult to irradiate the electron beam uniformly; and uneven irradiation may occur. An electron beam irradiation device that can suppress the uneven irradiation of the electron beam is desirable.

DETAILED DESCRIPTION

Figure 1:
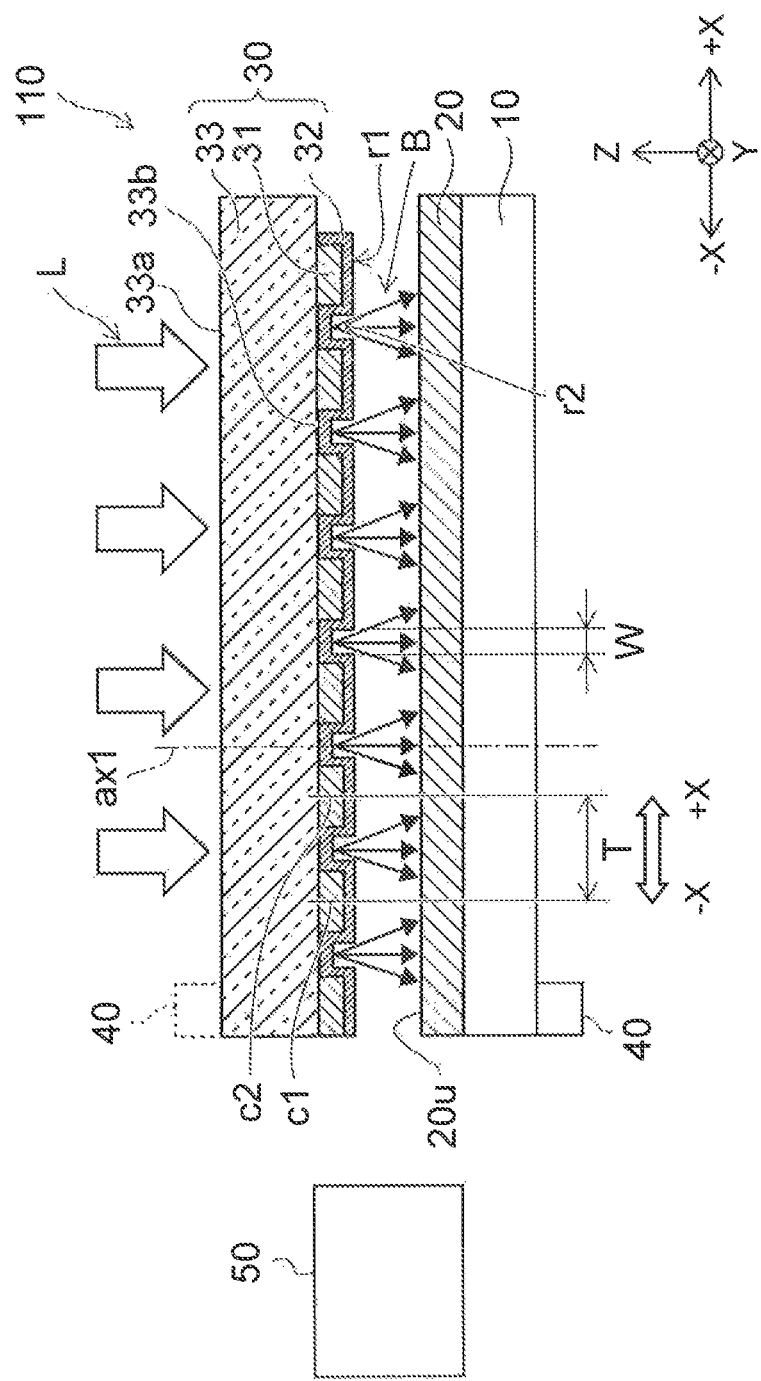
FIG. 1 is a schematic view showing an electron beam irradiation device according to a first embodiment.

According to one embodiment, an electron beam irradiation device includes a stage, a main body unit, and a first mechanism. The main body unit is provided above the stage. The main body unit includes a substrate, a plurality of first members, and a first layer. The plurality of first members is arranged to be separated from each other in a second direction. The plurality of first members is provided at a first surface of the substrate opposing the stage. The second direction intersects a first direction being from the stage toward the substrate. The first layer is provided between the stage and the plurality of first members and between the stage and the substrate. The first layer converts a light ray into an electron beam. The first mechanism is provided in at least one of the stage or the main body unit. The first mechanism moves at least one of the stage or the main body unit relatively in the second direction. A distance of the movement is not less than a spacing between a center in the second direction of the first member and a center in the second direction of one other first member adjacent to the first member.

According to another embodiment, an electron beam irradiation device includes a stage, a main body unit, and a first mechanism. The main body unit is provided above the stage. The main body unit includes a substrate, a plurality of first members, and a first layer. The plurality of first members is arranged to be separated from each other in a second direction. The plurality of first member is provided at a first surface of the substrate opposing the stage. The second direction intersects a first direction being from the stage toward the substrate. The first layer is provided between the stage and the plurality of first members and between the stage and the substrate. The first layer converts a light ray into an electron beam. The first mechanism is provided between the stage and the main body unit. The first mechanism changes a direction of the electron beam by generating a magnetic field or an electric field.

According to another embodiment, an electron beam irradiation device includes a stage, a main body unit, and a first mechanism. The main body unit is provided above the stage. The main body unit includes a substrate, a plurality of first members, and a first layer. The plurality of first members is arranged to be separated from each other in a second direction. The plurality of first members is provided at a first surface of the substrate opposing the stage. The second direction intersects a first direction being from the stage toward the substrate. The first layer is provided between the stage and the plurality of first members and between the stage and the substrate. The first layer converts a light ray into an electron beam. The first mechanism is provided in at least one of the stage or the main body unit. The first mechanism moves at least one of the stage or the main body unit relatively in the second direction.

According to another embodiment, an electron beam irradiation device includes a stage, a main body unit, and a first layer. The main body unit is provided above the stage. The main body unit includes a substrate, a plurality of first members, and a first layer. The plurality of first members is arranged to be separated from each other in a second direction. The plurality of first members is provided at a first surface of the substrate opposing the stage. The second direction intersects a first direction being from the stage toward the substrate. The first layer is provided between the stage and the plurality of first members and between the stage and the substrate. The first layer converts a light ray into an electron beam. The first mechanism is provided between the stage and the main body unit. The first mechanism moves an irradiation position of the electron beam in the second direction by deflecting the electron beam. A distance of the movement is not less than a spacing between a center in the second direction of the first member and a center in the second direction of one other first member adjacent to the first member.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings even in the case where the same portion is illustrated.

In this specification and each drawing, components similar to ones described in reference to an antecedent drawing

First Embodiment

FIG. 1 is a schematic view showing an electron beam irradiation device according to a first embodiment.

The electron beam irradiation device 110 according to the embodiment includes a stage 10, a main body unit 30, a first mechanism 40, and a direct current power supply 50.

It is possible to place an irradiation object 20 on the stage 10. The irradiation object 20 includes, for example, a semiconductor wafer, etc.

The main body unit 30 is provided above the stage 10 to be separated from the stage 10. The main body unit 30 includes a substrate 33, multiple first members 31, and a first layer 32. For example, the substrate 33 is light-transmissive. The material of the substrate 33 includes, for example, quartz, etc. The substrate 33 has an upper surface 33a and a lower surface 33b. For example, a light ray L of a wavelength that is not less than 100 nanometers (nm) and not more than 400 nm is incident on the upper surface 33a. The light ray L includes UV (ultraviolet) light of a relatively high frequency. A mercury lamp, a xenon lamp, a krypton lamp, a laser light source, or the like is used as the light source of the light ray L. For example, various light sources such as an LED (Light Emitting Diode), a flash lamp, etc., may be used as the light source.

Although an example is illustrated in the embodiment in which the light ray L is incident perpendicularly to the upper surface 33a of the substrate 33, the incident direction of the light ray L is not limited to perpendicular. The light ray L may be incident obliquely with respect to the upper surface 33a. This is similar for the embodiments described below.

The multiple first members 31 are provided between the stage 10 and the substrate 33. The multiple first members 31 are provided at a first surface (e.g., the lower surface 33b) of the substrate 33 opposing the stage 10. The multiple first members 31 are arranged to be separated from each other in a second direction intersecting a first direction, where the first direction is from the stage 10 toward the substrate 33. The first layer 32 is provided between the stage 10 and the multiple first members 31 and between the stage 10 and the substrate 33.

Here, a direction from the stage 10 toward the substrate 33 is taken as a Z-direction. One direction that intersects the Z-direction and is aligned with the upper surface 33a and the lower surface 33b of the substrate 33 is taken as an X-direction. One direction that intersects the Z-direction and the X-direction and is aligned with the upper surface 33a and the lower surface 33b of the substrate 33 is taken as a Y-direction. The first direction is, for example, the Z-direction. The second direction is, for example, the X-direction. A third direction is, for example, the Y-direction.

The regions where the first layer 32 and the first members 31 overlap are first regions r1. The region between two mutually-adjacent first members 31 is a second region r2. The first region r1 is a protrusion. The second region r2 is a recess. A width W of the second region r2 is, for example, not less than 0.2 μm (micrometers) and not more than 1.5 μm.

The multiple first members 31 and the first layer 32 are provided on the lower surface 33b side of the substrate 33. The multiple first members 31 are arranged to be separated from each other periodically in the X-direction. In the example, the multiple first members 31 extend in the Y-direction. For example, the multiple first members 31 have line configurations. The multiple first members 31 are patterned to be periodic and generate surface plasmon resonance. The material of the first member 31 includes, for example, at least one selected from the group consisting of gold, silver, titanium, aluminum, and chrome. In the example, the material of the first member 31 includes chrome.

The multiple first members 31 are provided according to a pattern in which surface plasmon resonance occurs. Surface plasmon resonance is, for example, a phenomenon in which a compression wave (a surface plasmon wave) of free electrons of a metal surface resonates with an evanescent wave generated by incident light and is excited when the light is on incident on the metal surface. Surface plasmon resonance occurs in a designated wavelength region corresponding to the type, configuration, and size of the metal, the substances of the surroundings, etc. The electric field is enhanced at the surface of the metal and at the vicinity of the metal by the surface plasmon resonance. The current density obtained for the case where the pattern is provided is about 10 times that of the case where the pattern is not provided.

The first layer 32 covers the multiple first members 31 and a portion of the substrate 33 where the multiple first members 31 are not provided. The first layer 32 has a photoelectric conversion function of converting the light ray L into an electron beam B. The first layer 32 includes a conductive material that emits the electron beam B due to a photoelectric effect. The first layer 32 includes, for example, at least one of gold or ruthenium. Other than a metal, the first layer 32 may include, for example, a metal oxide, a superlattice semiconductor of GaAs/GaAsP or the like, etc. In the example, the first layer 32 includes gold. For example, the thickness of the first layer 32 is not less than 10 nm and not more than 30 nm.

The electron beam B that is emitted from the first layer 32 is irradiated on the irradiation object 20 placed on the stage 10. The direct current power supply 50 applies a direct current voltage between the first layer 32 and the irradiation object 20 to accelerate the electron beam B. In such a case, the voltage may be changed according to the necessary acceleration and may be set to be, for example, not less than 100 V and not more than several tens of kV.

The electron beam irradiation device 110 according to the embodiment includes the first mechanism 40. The first mechanism 40 is provided in at least one of the stage 10 or the main body unit 30. The first mechanism 40 moves at least one of the stage 10 or the main body unit 30 relatively in the X-direction. The distance of the movement is not less than a spacing T. The spacing T is the distance between a center c1 in the X-direction of the first member 31 and a center c2 in the X-direction of one other first member 31 adjacent to the first member 31. The spacing T corresponds to the period at which the multiple first members 31 are arranged. The spacing T is, for example, 2 micrometers (μm) or less. The first mechanism 40 repeats the movement with a first axis ax1 as a center. In other words, the first mechanism 40 causes at least one of the stage 10 or the main body unit 30 to reciprocate relatively over a width that is not less than the spacing T. The first axis ax1 is one imaginary axis along the Z-direction that passes through the stage 10 and the main body unit 30.

The first mechanism 40 is a mechanism that causes the irradiation amount of the electron beam B at an upper surface 20u of the irradiation object 20 to be substantially uniform. For example, the first mechanism 40 is provided in the stage 10. The first mechanism 40 causes the stage 10 to reciprocate over a width not less than the spacing T with respect to the main body unit 30 with the first axis ax1 as the center. The first mechanism 40 causes a micro reciprocation of the stage 10. The first mechanism 40 includes, for example, an actuator that uses a piezoelectric element. Various methods for the irradiation time, the reciprocation amount, etc., are employable as the first mechanism 40.

It is sufficient for the reciprocation amount of the stage 10 to be not less than the spacing T of the multiple first members 31. For example, if the spacing T is 2 μm, the stage 10 is caused to reciprocate over a width not less than 2 μm with respect to the main body unit 30 with the first axis ax1 as the center. The reciprocation directions are the +X direction and the −X direction. By the reciprocation that is not less than the spacing T, the irradiation amount of the electron beam B at the upper surface 20u of the irradiation object 20 is caused to be substantially uniform.

The first mechanism 40 may be provided in the main body unit 30. In such a case, the first mechanism 40 causes the main body unit 30 to reciprocate over a width not less than the spacing T with respect to the stage 10 with the first axis ax1 as the center. The first mechanism 40 causes a micro reciprocation of the main body unit 30.

Thus, according to the embodiment, the first mechanism 40 can cause the electron beam B to be irradiated uniformly on the upper surface 20u of the irradiation object 20. Thereby, uneven irradiation of the electron beam B can be suppressed. Surface plasmon resonance can be generated by providing the multiple first members 31 that are patterned to be periodic. Therefore, the current density can be increased; and the efficiency of the photoelectric conversion can be increased.

By using the electron beam irradiation device 110 of the embodiment, it is possible to efficiently irradiate the electron beam B on, for example, a semiconductor material, etc. For example, when the electron beam B is irradiated after resist formation, the resist can be modified; and the resistance in the subsequent etching process can be improved.

Figure 2A:
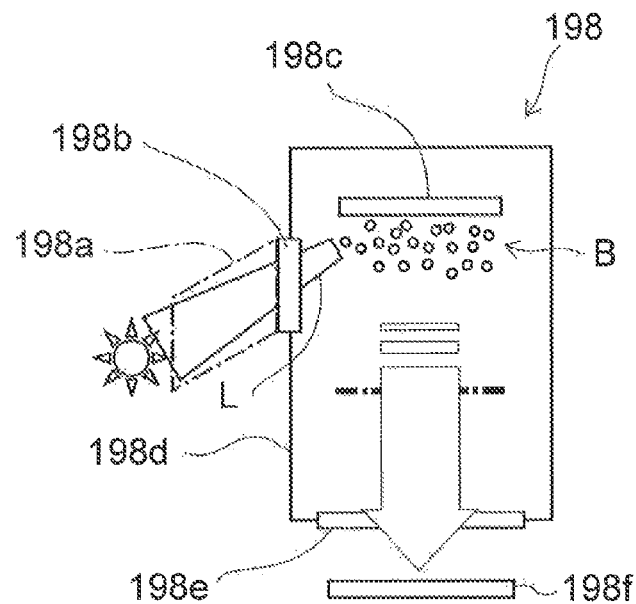
FIG. 2A and FIG. 2B are schematic views showing electron beam irradiation devices according to reference examples.
Figure 2B:
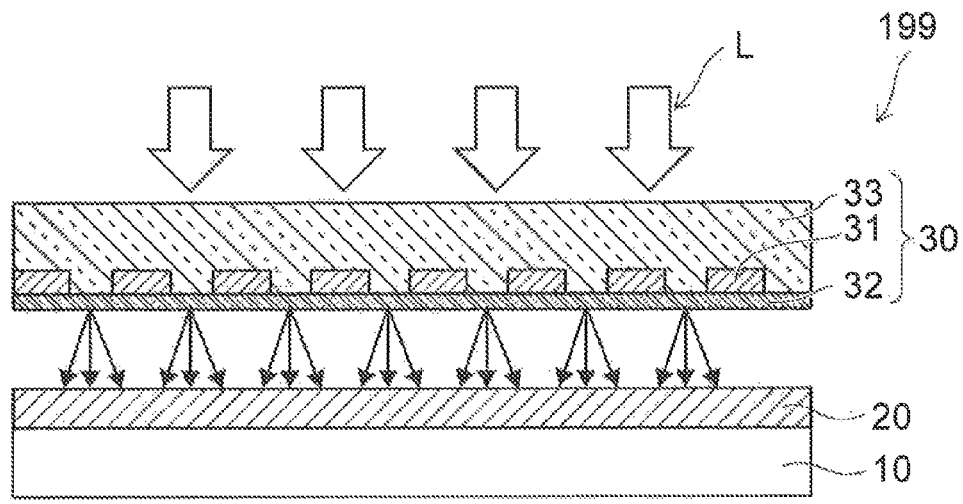

FIG. 2A and FIG. 2B are schematic views showing electron beam irradiation devices according to reference examples.

FIG. 2A and FIG. 2B are different reference examples.

As shown in FIG. 2A, the electron beam irradiation device 198 includes an optical guide 198a, a light receiving window 198b, a photocathode 198c, a vacuum container 198d, and a beam extraction window 198e. The photocathode 198c and the beam extraction window 198e are provided in the vacuum container 198d. An irradiation object 198f is provided at a position opposing the beam extraction window 198e.

The light ray L (the UV light) that is emitted from the light source enters the interior of the vacuum container 198d from the light receiving window 198b via the optical guide 198a. The light ray L that enters the interior of the vacuum container 198d is irradiated on the photocathode 198c. The photocathode 198c performs photoelectric conversion of the light ray L and emits the electron beam B. The electron beam B is irradiated on the irradiation object 198f via the beam extraction window 198e.

Although a method that utilizes photoelectric conversion is employed in the electron beam irradiation device 198, it is difficult to obtain a high current density because the efficiency of the photoelectric conversion is insufficient.

Conversely, the electron beam irradiation device 199 shown in FIG. 2B utilizes surface plasmon resonance. In the electron beam irradiation device 199, the efficiency of the photoelectric conversion is increased by utilizing surface plasmon resonance; and a high current density can be obtained.

In the case where surface plasmon resonance is utilized, it is necessary to provide a periodic pattern in the photoelectric conversion surface. The pattern undesirably limits the travel direction of the electron beam; and it is difficult to irradiate the electron beam uniformly on the irradiation object. Therefore, uneven irradiation of the electron beam may occur.

Conversely, the electron beam irradiation device 110 according to the embodiment includes the first mechanism 40. The first mechanism 40 is provided in at least one of the stage 10 or the main body unit 30. The first mechanism 40 causes at least one of the stage 10 or the main body unit 30 to reciprocate over a width not less than the spacing T with the first axis ax1 as the center. Thereby, the electron beam B can be irradiated uniformly on the irradiation object 20. Thereby, the uneven irradiation of the electron beam B can be suppressed.

Second Embodiment

Figure 3A:
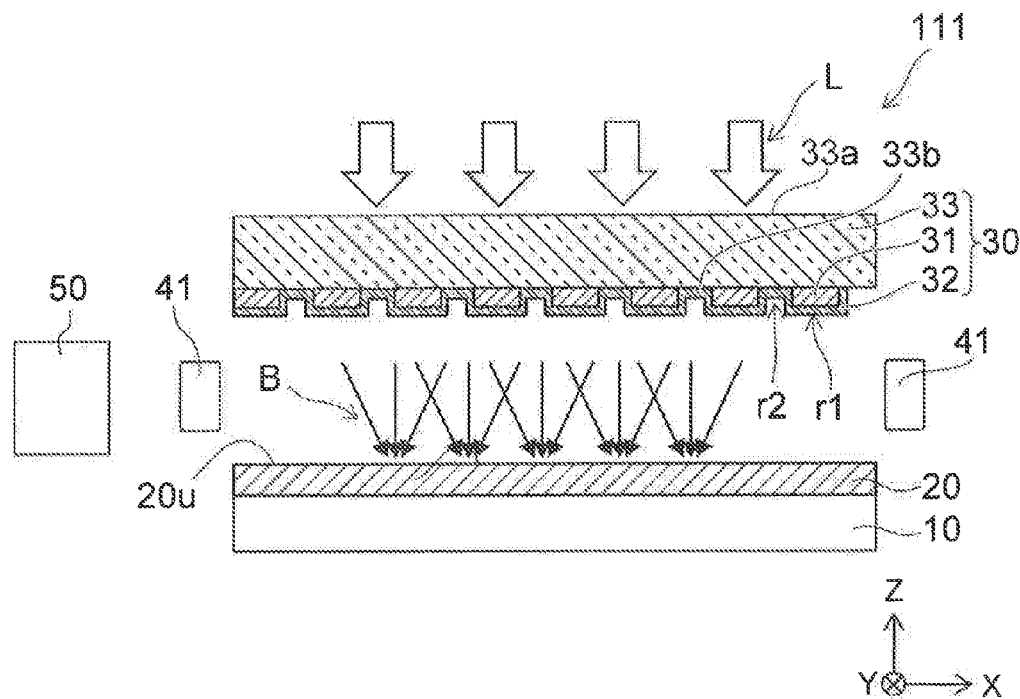
FIG. 3A and FIG. 3B are schematic views showing an electron beam irradiation devices according to a second embodiment.
Figure 3B:
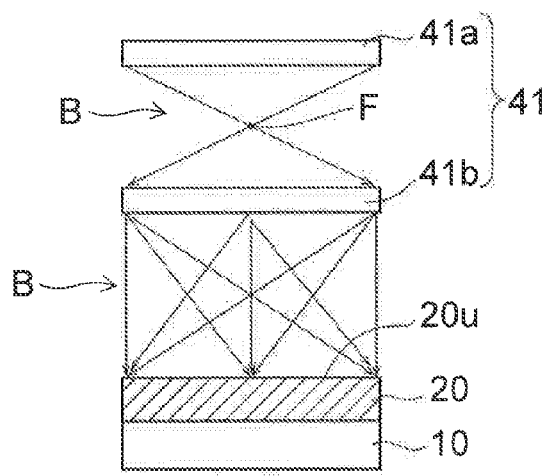

FIG. 3A and FIG. 3B are schematic views showing an electron beam irradiation device according to a second embodiment.

FIG. 3A is a schematic view showing the electron beam irradiation device.

FIG. 3B schematically shows the state of the electron beam of the electron beam irradiation device of FIG. 3A.

As shown in FIG. 3A, the electron beam irradiation device 111 according to the embodiment includes the stage 10, the main body unit 30, a first mechanism 41, and the direct current power supply 50.

It is possible to place the irradiation object 20 on the stage 10. The irradiation object 20 includes, for example, a semiconductor wafer, etc.

The main body unit 30 includes the substrate 33, the multiple first members 31, and the first layer 32. The multiple first members 31 and the first layer 32 are provided on the lower surface 33b side of the substrate 33. The multiple first members 31 are arranged to be separated from each other periodically in the X-direction. In the example, the multiple first members 31 extend in the Y-direction. For example, the multiple first members 31 have line configurations. The multiple first members 31 are patterned to be periodic and generate surface plasmon resonance. The material of the first member 31 includes, for example, at least one selected from the group consisting of gold, silver, titanium, aluminum, and chrome. In the example, the material of the first member 31 includes chrome.

The first layer 32 covers the multiple first members 31 and a portion of the substrate 33 where the multiple first members 31 are not provided. The first layer 32 has a photoelectric conversion function of converting the light ray L into the electron beam B. The first layer 32 includes a conductive material that emits the electron beam B due to the photoelectric effect. The first layer 32 includes, for example, at least one of gold or ruthenium. Other than a metal, the first layer 32 may include, for example, a metal oxide, a superlattice semiconductor of GaAs/GaAsP or the like, etc. In the example, the first layer 32 includes gold.

The electron beam irradiation device 111 according to the embodiment includes the first mechanism 41. The first mechanism 41 is provided between the main body unit 30 and the stage 10. The first mechanism 41 changes (refracts) the direction of the electron beam B by generating a magnetic field or an electric field. Thereby, the focal point of the electron beam B is formed at a position other than the upper surface 20u of the irradiation object 20. The first mechanism 41 includes, for example, an electron lens. The electron lens may be a magnetic lens that utilizes a magnetic field or an electrostatic lens that utilizes an electric field (also called an electrostatic lens). Both the magnetic lens and the electrostatic lens are applicable to the first mechanism 41.

The direction of the electron beam B emitted from the first layer 32 is changed by the first mechanism 41. By adjusting the design and arrangement of the first mechanism 41, it is possible to form the image of the electron beam B at infinity based on the multiple first region r1 and the multiple second region r2. Such an arrangement is based on a method called Köhler illumination. Köhler illumination is one method to illuminate a surface uniformly. By applying Köhler illumination to the electron beam irradiation, the irradiation amount at the upper surface 20u of the irradiation object 20 can be substantially uniform.

As shown in FIG. 3B, the first mechanism 41 includes a first electron lens unit 41a and a second electron lens unit 41b. The second electron lens unit 41b is provided between the first electron lens unit 41a and the stage 10. A focal point F of the electron beam B is positioned between the first electron lens unit 41a and the second electron lens unit 41b. For example, the first electron lens unit 41a functions as a condenser lens that converges the electron beam B. For example, the second electron lens unit 41b functions as an objective lens. That is, the first electron lens unit 41a forms an image of the electron beam B at a focal surface frontward of the second electron lens unit 41b. In other words, the electron beam B that is emitted from the first electron lens unit 41a passes through the focal point F of the second electron lens unit 41b and passes through the second electron lens unit 41b. Thereby, the electron beam B that is emitted from the second electron lens unit 41b can be parallel.

In the case of the magnetic lens, each of the first electron lens unit 41a and the second electron lens unit 41b includes a coil. Each of the first electron lens unit 41a and the second electron lens unit 41b generates a magnetic field by causing a current to flow through the coil. In the case of the electrostatic lens, each of the first electron lens unit 41a and the second electron lens unit 41b includes an electrode. Each of the first electron lens unit 41a and the second electron lens unit 41b generates an electric field by applying a voltage to the electrode.

Thus, according to the embodiment, a parallel electron beam B is emitted from the second electron lens unit 41b. Therefore, the electron beam B is irradiated uniformly on the upper surface 20u of the irradiation object 20. Thereby, the uneven irradiation of the electron beam B can be suppressed. Surface plasmon resonance can be generated by providing the multiple first members 31 that are patterned to be periodic. Thereby, the current density can be increased; and the efficiency of the photoelectric conversion can be increased.

Third Embodiment

Figure 4:
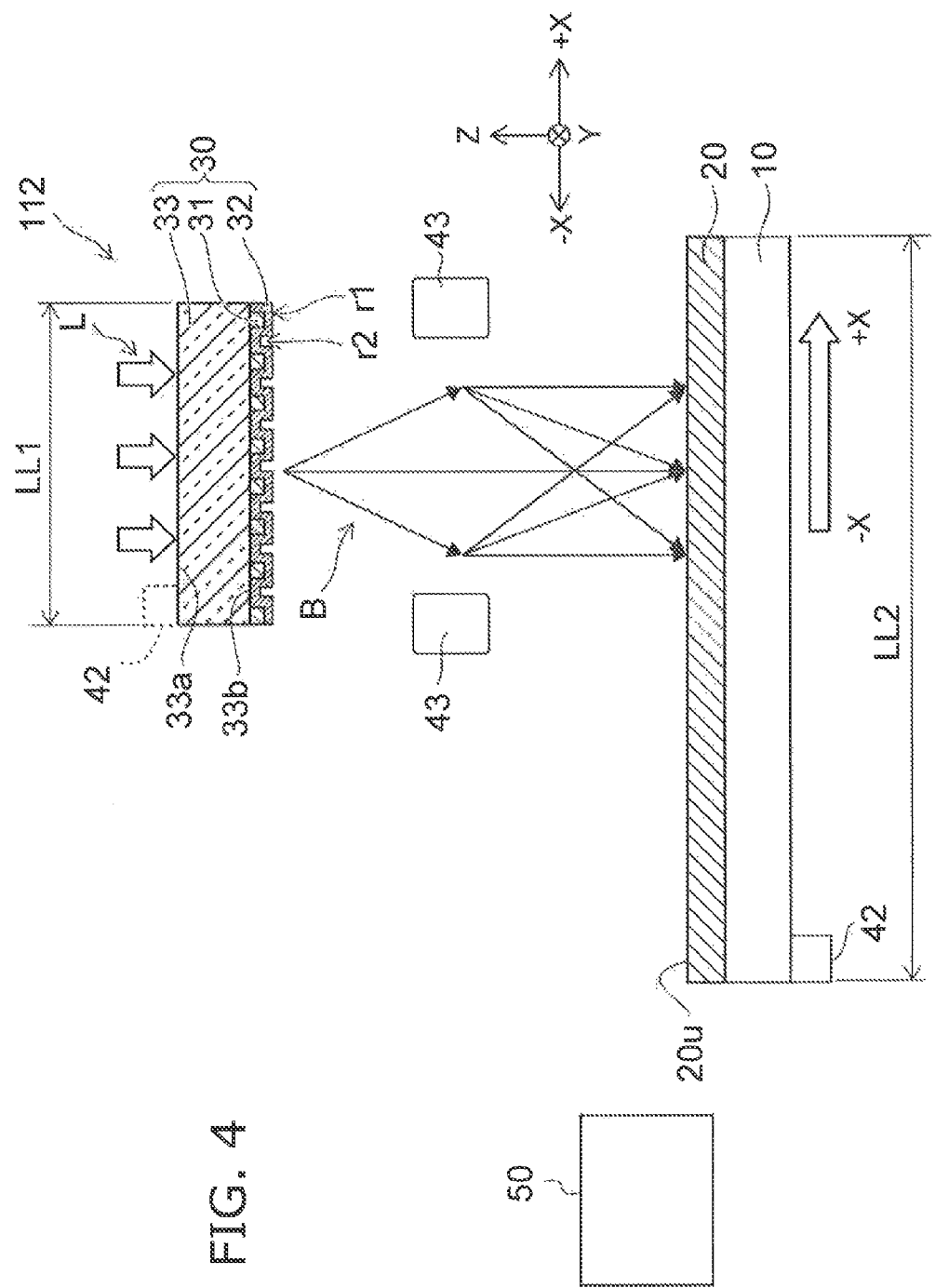
FIG. 4 is a schematic view showing an electron beam irradiation device according to a third embodiment.

FIG. 4 is a schematic view showing an electron beam irradiation device according to a third embodiment.

The electron beam irradiation device 112 according to the embodiment includes the stage 10, the main body unit 30, a first mechanism 42, a second mechanism 43, and the direct current power supply 50.

It is possible to place the irradiation object 20 on the stage 10. The irradiation object 20 includes, for example, a semiconductor wafer, etc.

The main body unit 30 includes the substrate 33, the multiple first members 31, and the first layer 32. The multiple first members 31 and the first layer 32 are provided on the lower surface 33b side of the substrate 33. The multiple first members 31 are arranged to be separated from each other periodically in the X-direction. In the example, the multiple first members 31 extend in the Y-direction. For example, the multiple first members 31 have line configurations. The multiple first members 31 are patterned to be periodic and generate surface plasmon resonance. The material of the first member 31 includes, for example, at least one selected from the group consisting of gold, silver, titanium, aluminum, and chrome. In the example, the material of the first member 31 includes chrome.

The first layer 32 covers the multiple first members 31 and a portion of the substrate 33 where the multiple first members 31 are not provided. The first layer 32 has a photoelectric conversion function of converting the light ray L into the electron beam B. The first layer 32 includes a conductive material that emits the electron beam B due to the photoelectric effect. The first layer 32 includes, for example, at least one of gold or ruthenium. Other than a metal, the first layer 32 may include, for example, a metal oxide, a superlattice semiconductor of GaAs/GaAsP or the like, etc. In the example, the first layer 32 includes gold.

The electron beam irradiation device 112 according to the embodiment includes the first mechanism 42. The first mechanism 42 is provided in at least one of the stage 10 or the main body unit 30. It is desirable for a length LL1 along the X-direction of the main body unit 30 to be shorter than a length LL2 along the X-direction of the stage 10. The first mechanism 42 moves at least one of the stage 10 or the main body unit 30 relatively in the X-direction. The first mechanism 42 causes the stage 10 or the main body unit 30 to move at a uniform speed. The movement direction is the +X direction or the -X direction. The first mechanism 42 includes, for example, a general actuator.

For example, the first mechanism 42 is provided in the stage 10. The first mechanism 42 moves the stage 10 with respect to the main body unit 30. The first mechanism 42 may be provided in the main body unit 30. In such a case, the first mechanism 42 moves the main body unit 30 with respect to the stage 10.

Thus, according to the embodiment, at least one of the main body unit 30 or the stage 10 is moved relatively in the X-direction. Therefore, the electron beam B can be irradiated uniformly on the irradiation object 20. Thereby, the uneven irradiation of the electron beam B can be suppressed. Surface plasmon resonance can be generated by providing the multiple first members 31 that are patterned to be periodic. Thereby, the current density can be increased; and the efficiency of the photoelectric conversion can be increased.

The electron beam irradiation device 112 may further include the second mechanism 43. The second mechanism 43 is provided between the main body unit 30 and the stage 10. The second mechanism 43 changes (refracts) the direction of the electron beam B by generating a magnetic field or an electric field. Thereby, the focal point of the electron beam B is formed at a position other than the upper surface 20u of the irradiation object 20. The second mechanism 43 includes, for example, an electron lens.

Thus, by further providing the second mechanism 43 in addition to the first mechanism 42, the uniformity of the irradiation amount of the electron beam B on the irradiation object 20 can be increased further. Thereby, the uneven irradiation of the electron beam B can be suppressed more effectively.

Fourth Embodiment

Figure 5:
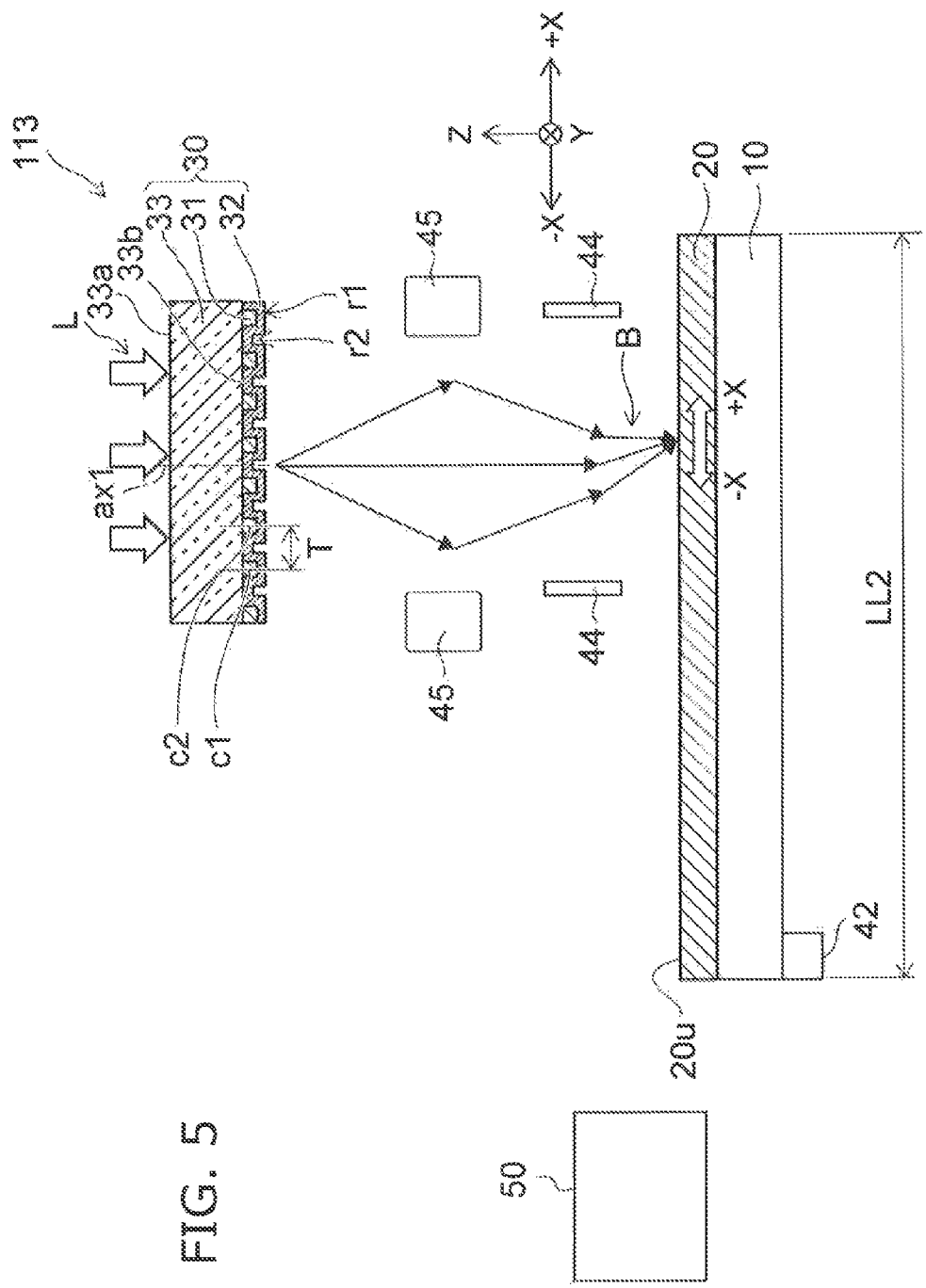
FIG. 5 is a schematic view showing an electron beam irradiation device according to a fourth embodiment.

FIG. 5 is a schematic view showing an electron beam irradiation device according to a fourth embodiment.

Figure 6:
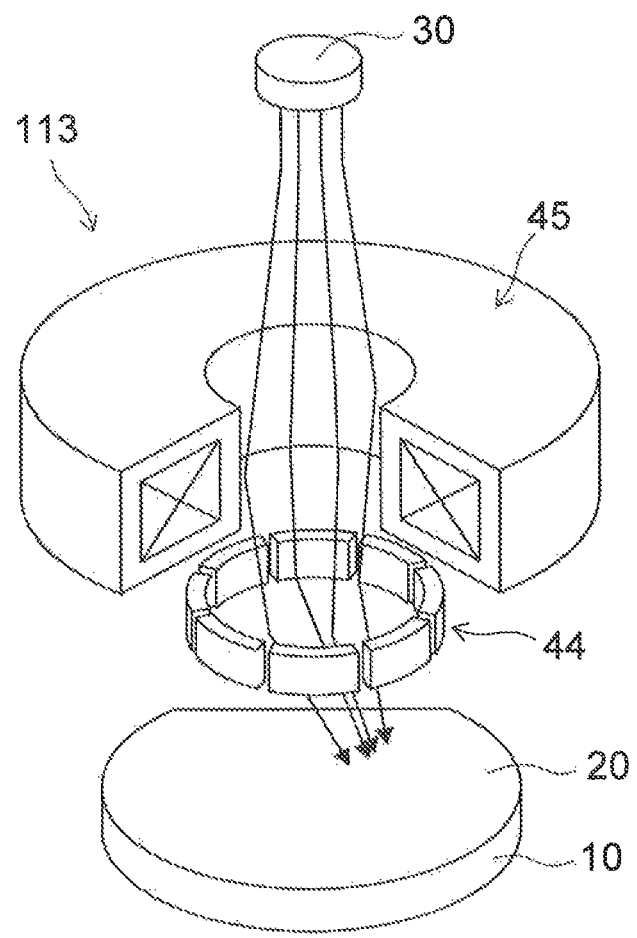
FIG. 6 is a schematic perspective view showing the electron beam irradiation device according to the fourth embodiment.

FIG. 6 is a schematic perspective view showing the electron beam irradiation device according to the fourth embodiment.

The electron beam irradiation device 113 according to the embodiment includes the stage 10, the main body unit 30, a first mechanism 44, a second mechanism 45, and the direct current power supply 50.

It is possible to place the irradiation object 20 on the stage 10. The irradiation object 20 includes, for example, a semiconductor wafer, etc.

The main body unit 30 includes the substrate 33, the multiple first members 31, and the first layer 32. The multiple first members 31 and the first layer 32 are provided on the lower surface 33b side of the substrate 33. The multiple first members 31 are arranged to be separated from each other periodically in the X-direction. In the example, the multiple first members 31 extend in the Y-direction. For example, the multiple first members 31 have line configurations. The multiple first members 31 are patterned to be periodic and generate surface plasmon resonance. The material of the first member 31 includes, for example, at least one selected from the group consisting of gold, silver, titanium, aluminum, and chrome. In the example, the material of the first member 31 includes chrome.

The first layer 32 covers the multiple first members 31 and a portion of the substrate 33 where the multiple first members 31 are not provided. The first layer 32 has a photoelectric conversion function of converting the light ray L into the electron beam B. The first layer 32 includes a conductive material that emits the electron beam B due to the photoelectric effect. The first layer 32 includes, for example, at least one of gold or ruthenium. Other than a metal, the first layer 32 may include, for example, a metal oxide, a superlattice semiconductor of GaAs/GaAsP or the like, etc. In the example, the first layer 32 includes gold.

The electron beam irradiation device 113 according to the embodiment includes the first mechanism 44. The first mechanism 44 is provided between the main body unit 30 and the stage 10. The first mechanism 44 moves the irradiation position of the electron beam B at the upper surface 20u of the irradiation object 20 in the X-direction by deflecting the electron beam B. The distance of the movement is not less than the spacing T. The first mechanism 40 repeats the movement with the first axis ax1 as the center. That is, the first mechanism 44 causes the irradiation position of the electron beam B at the upper surface 20u of the irradiation object 20 to reciprocate over a width not less than the spacing T by deflecting the electron beam B. The reciprocation directions are the +X direction and the −X direction. The first mechanism 44 includes, for example, a deflector.

Thus, according to the embodiment, similarly to the first to third embodiments, the electron beam B can be irradiated uniformly on the irradiation object 20. Thereby, the uneven irradiation of the electron beam B can be suppressed. Surface plasmon resonance can be generated by providing the multiple first members 31 that are patterned to be periodic. Thereby, the current density can be increased; and the efficiency of the photoelectric conversion can be increased.

The electron beam irradiation device 113 may further include the second mechanism 45. The second mechanism 45 is provided between the first mechanism 44 and the main body unit 30. The second mechanism 45 changes (refracts) the direction of the electron beam B by generating a magnetic field or an electric field. Thereby, the focal point of the electron beam B is formed at a position other than the upper surface 20u of the irradiation object 20. The second mechanism 45 includes, for example, an electron lens.

Thus, by further providing the second mechanism 45 in addition to the first mechanism 44, the uniformity of the irradiation amount of the electron beam B on the irradiation object 20 can be increased further. Thereby, the uneven irradiation of the electron beam B can be suppressed more effectively.

An example is illustrated in the first to fourth embodiments in which the light ray L enters from the upper surface 33a of the substrate 33. The light ray L may be incident obliquely from the first layer 32 side. In such a case, the substrate 33 may not be light-transmissive.

According to the embodiments, an electron beam irradiation device that can suppress the uneven irradiation of the electron beam can be provided.

Hereinabove, embodiments of the invention are described with reference to specific examples. However, the invention is not limited to these specific examples. For example, one skilled in the art may similarly practice the invention by appropriately selecting specific configurations of components such as the stage, the main body unit and the first mechanism, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all electron beam irradiation devices practicable by an appropriate design modification by one skilled in the art based on the electron beam irradiation devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. An electron beam irradiation device, comprising:
   a stage to support an irradiation object to be placed thereon;
   a main body unit provided above the stage, the main body unit including a substrate to transmit a light ray,
a plurality of first members arranged to be separated from each other in a second direction and provided at a first surface of the substrate opposing the stage so as to generate surface plasmon resonance when the light ray is transmitted through the substrate, the second direction intersecting a first direction, the first direction being from the stage toward the substrate, and
a first layer provided between the stage and the plurality of first members and between the stage and the substrate, the first layer converting the light ray into an electron beam for irradiating the irradiation object; and
a first mechanism provided in at least one of the stage or the main body unit, the first mechanism moving at least one of the stage or the main body unit relatively in the second direction,
a distance of the movement being not less than a spacing between a center in the second direction of the first member and a center in the second direction of one other first member adjacent to the first member.

2. The device according to claim 1, wherein the first mechanism repeats the movement with a first axis along the first direction as a center.

3. The device according to claim 1, wherein the spacing is 2 micrometers or less.

4. The device according to claim 1, wherein a wavelength of the light ray is not less than 100 nanometers and not more than 400 nanometers.

5. The device according to claim 1, wherein
the substrate has an upper surface, and
the light ray enters from the upper surface.

6. The device according to claim 1, wherein the first member includes at least one selected from the group consisting of gold, silver, titanium, aluminum, and chrome.

7. The device according to claim 1, wherein the first layer includes at least one of gold or ruthenium.

8. An electron beam irradiation device, comprising:
a stage to support an irradiation object to be placed thereon;
a main body unit provided above the stage, the main body unit including
a substrate to transmit a light ray,
a plurality of first members arranged to be separated from each other in a second direction and provided at a first surface of the substrate opposing the stage so as to generate surface plasmon resonance when the light ray is transmitted through the substrate, the second direction intersecting a first direction, the first direction being from the stage toward the substrate, and
a first layer provided between the stage and the plurality of first members and between the stage and the substrate, the first layer converting the light ray into an electron beam for irradiating the irradiation object; and
a first mechanism provided between the stage and the main body unit, the first mechanism changing a direction of the electron beam by generating a magnetic field or an electric field.

9. The device according to claim 8, wherein
the first mechanism includes a first electron lens unit and a second electron lens unit, the electron beam being incident on the first electron lens unit, the second electron lens unit being provided between the first electron lens unit and the stage, and
a focal point of the electron beam is positioned between the first electron lens unit and the second electron lens unit.

10. The device according to claim 8, wherein a wavelength of the light ray is not less than 100 nanometers and not more than 400 nanometers.

11. An electron beam irradiation device, comprising:
a stage to support an irradiation object to be placed thereon;
a main body unit provided above the stage, the main body unit including
a substrate to transmit a light ray,
a plurality of first members arranged to be separated from each other in a second direction and provided at a first surface of the substrate opposing the stage so as to generate surface plasmon resonance when the light ray is transmitted through the substrate, the second direction intersecting a first direction, the first direction being from the stage toward the substrate, and
a first layer provided between the stage and the plurality of first members and between the stage and the substrate, the first layer converting the light ray into an electron beam for irradiating the irradiation object; and
a first mechanism provided in at least one of the stage or the main body unit, the first mechanism moving at least one of the stage or the main body unit relatively in the second direction.

12. The device according to claim 11, wherein a length along the second direction of the main body unit is shorter than a length along the second direction of the stage.

13. The device according to claim 11, further comprising a second mechanism provided between the main body unit and the stage,
the second mechanism changing a direction of the electron beam by generating a magnetic field or an electric field.

14. The device according to claim 11, wherein a wavelength of the light ray is not less than 100 nanometers and not more than 400 nanometers.

15. An electron beam irradiation device, comprising:
a stage to support an irradiation object to be placed thereon;
a main body unit provided above the stage, the main body unit including
a substrate to transmit a light ray,
a plurality of first members arranged to be separated from each other in a second direction and provided at a first surface of the substrate opposing the stage so as to generate surface plasmon resonance when the light ray is transmitted through the substrate, the second direction intersecting a first direction, the first direction being from the stage toward the substrate, and
a first layer provided between the stage and the plurality of first members and between the stage and the substrate, the first layer converting the light ray into an electron beam for irradiating the irradiation object; and
a first mechanism provided between the stage and the main body unit, the first mechanism moving an irradiation position of the electron beam in the second direction by deflecting the electron beam,
a distance of the movement being not less than a spacing between a center in the second direction of the first member and a center in the second direction of one other first member adjacent to the first member.

16. The device according to claim 15, wherein the first mechanism repeats the movement with a first axis along the first direction as a center.

17. The device according to claim 15, further comprising a second mechanism provided between the first mechanism and the main body unit, the second mechanism changing a direction of the electron beam by generating a magnetic field or an electric field.

18. The device according to claim 15, wherein the spacing is 2 micrometers or less.

19. The device according to claim 15, wherein a wavelength of the light ray is not less than 100 nanometers and not more than 400 nanometers.

* * * * *